(12) United States Patent
Shaeffer

(10) Patent No.: US 7,844,407 B1
(45) Date of Patent: Nov. 30, 2010

(54) SYSTEMS AND METHODS FOR ANALYSIS AND DESIGN OF RADIATING AND SCATTERING OBJECTS

(76) Inventor: John Fredrick Shaeffer, 3278 Hunterdon Way, Marietta, GA (US) 30067

( * ) Notice: Subject to any disclaimer, the term of this patent is extended or adjusted under 35 U.S.C. 154(b) by 274 days.

(21) Appl. No.: 12/215,034

(22) Filed: Jun. 24, 2008

Related U.S. Application Data

(63) Continuation-in-part of application No. 11/716,405, filed on Mar. 10, 2007, now abandoned.

(51) Int. Cl.
*G01R 29/08* (2006.01)
*G06F 19/00* (2006.01)
*G06F 17/40* (2006.01)

(52) U.S. Cl. .................. 702/57; 324/457; 343/703

(58) Field of Classification Search .......... 250/526; 324/76.11, 144, 157, 158.1, 457; 343/700 R, 343/703; 702/1, 57, 127, 187, 189, 190, 702/196
See application file for complete search history.

(56) References Cited

U.S. PATENT DOCUMENTS

| | | | | |
|---|---|---|---|---|
| 2,839,246 A | * | 6/1958 | Andrews | 235/58 M |
| 3,283,241 A | * | 11/1966 | Forbes | 324/457 |
| 3,370,225 A | * | 2/1968 | Winder | 324/457 |
| 7,742,886 B2 | * | 6/2010 | Shaeffer | 702/64 |
| 2004/0010400 A1 | | 1/2004 | Canning | |
| 2004/0078174 A1 | | 4/2004 | Canning | |
| 2006/0195306 A1 | | 8/2006 | Canning | |
| 2006/0265200 A1 | | 11/2006 | Canning | |
| 2009/0132187 A1 | * | 5/2009 | Shaeffer | 702/64 |

OTHER PUBLICATIONS

"A Sparse Matrix Artihmetic Based on H-Matrices", Hackbush, Computing 62,89-108(1999).
"Approximation of Boundary Element Matrices", Bebendorf, Numer.Math(2000) 86:565-589.
"The Adaptive Cross Aproximation Technique for the 3D Boundary Element Method", Kurz, IEEE Transactions on Magnetics, vol. 38 No. 2 Mar. 2002.
"Existence of H Matrix Approximants to the Inverse FE-Matrix of Elliptic Operators With L Coefficients", Bebendorf, Numer.Math. (2003) 95:1-28.
Efficient Inversion of the Galerkin Matrix of General Second Order Elliptic Operators With Nonsmooth Coefficients, Bebendorf, Math. of Computation, vol. 74, No. 251, 1179-119, Sep. 2004.
"Hierarchical Lu Decomposition Based Preconditioners for BEM", Bebendorf,Computing 74, 225-247 (2005).
"Why Approximate Lu Decompositions of Finite Element Discretizations of Elliptic Operators Can Be Computed With Almost Linear Complexity" Bebendorf, Jan. 24, 2005.
"Approximate Inverse Preconditioning of Finite Element Discretizations of Elliptic Operators With Nonsmooth Coefficients" Bebendorf, Siam J Matrix Anal. Appl. Vo. 27 No. 4, 909 Feb. 2006.

(Continued)

*Primary Examiner*—Edward R Cosimano
(74) *Attorney, Agent, or Firm*—Patrick Stellitano

(57) ABSTRACT

Methods and apparatus for analysis and design of radiation and scattering objects are disclosed. In one embodiment, unknown sources are spatially grouped to produce a system interaction matrix with block factors of low rank within a given error tolerance and the unknown sources are determined from compressed forms of the factors.

19 Claims, 5 Drawing Sheets

OTHER PUBLICATIONS

"Fast BEM Solution of Laplace Problems With H Matrices and ACA", Ostrowski, IEEE Trans. On Magnetics, vol. 42, No. 4, Apr. 2006.

"Derivation of a Block Algorithm for LU Factorization", Jack Dongara, webpage: netlib.org/utk/papers/siam-review93/node13.html, Feb. 9, 1997.

"LU Factorization Example," Lumsdaine, Siek, webpage: os1.iu.edu/research/mtl/tutorial.php3, Jul. 27, 1998.

Canning, Francis X., "Simply Sparse: A New and General Fast Method" EMCC 2002, Kirtland Air Force Base, May 8, 2002.

Kurz, et al., "Application of the Adaptive Cross Approximation Technique for the Coupled BE-FE Solution of Electromagnetic Problems", IABEM 2002, Austin, TX May 28-30, 2002.

Shaeffer, et.al., Adaptive Cross Approximation for Mom Matrix Fill for PC Problem Sizes to 157,000 Unknowns, Aces, Honolulu, HI, Mar. 2005.

Burkholder, et.al., "Fast Dual-Mgs Block Factorization Algorithm for Dense Mom Matrices", IEEE Transactions on Antennas and Propagation, vol. 52, No. 7, Jul. 2004.

Shaeffer, et.al., "Preliminary Scaling of Sparse Mom on a PC for Problem Sizes From 2,592 to 157,059 Unknowns" EMCC, Seattle, WN, May 2004.

Zhao, et.al., "The Adaptive Cross Approximation Algorithm for Accelerated Method of Moments Computations of EMC Problems", IEEE Trans. on EM Compat., Vo. 47, No. 4, Nov. 2005.

Rjasanow, 'Adaptive Cross Approximation of Dense Matrices, IABEM 2002, Austin, TX May 28-30, 2002.

Rao, et.al., "Electromagnetic Scattering by Surfaces of Arbitrary Shape", IEEE Trans. on Antennas and Propagation, vol. 30, No. 3, May 1982.

* cited by examiner

SYSTEMS AND METHODS FOR ANALYSIS AND DESIGN OF RADIATING AND SCATTERING OBJECTS

PRIORITY

This application is a continuation in part of, and claims priority of, U.S. patent application Ser. No. 11/716,405, filed on Mar. 10, 2007, now abandoned, which is incorporated herein by reference for all purposes.

FIELD

The present invention is in the field of analysis and design of radiating and scattering objects.

BACKGROUND

An important problem in the field of electromagnetics is the analysis and design of radiating and scattering objects. In one frequency domain formulation, the electric and magnetic fields scattered/radiated from a material object are given by:

$$\bar{E}^s = \oint_s [j\omega\mu(\bar{n}\times\bar{H})\psi + (\bar{n}\times\bar{E})\times\nabla\psi + (\bar{n}\cdot\bar{E})\nabla\psi]dS$$

$$\bar{H}^s = \oint_s [j\omega\varepsilon(\bar{n}\times\bar{E})\psi + (\bar{n}\times\bar{H})\times\nabla\psi - (\bar{n}\cdot\bar{H})\nabla\psi]dS$$

where $E^s$ and $H^s$ are the scattered/radiated electric and magnetic fields. The vectors, E and H, are the total electric and magnetic fields. The tangential and normal components of the total fields are interpreted as currents and charges:

$\bar{J}=\hat{n}\times\bar{H}$ electric current $\bar{M}=\hat{n}\times\bar{E}$ magnetic current $\rho = \varepsilon \hat{n}\cdot\bar{E}$ electric charge $\rho^* = \mu \hat{n}\cdot\bar{H}$ magnetic charge The function $\psi$ is a Greens function that may be interpreted as an outward-traveling spherical wavelet:

$$\psi = \frac{e^{jkR}}{4\pi R}$$

where R is the distance from a source point to an observation point. The scattered fields at an observation point are thus viewed, as the summation of spherical wavelets emanating from electric and magnetic current sources and charges on the boundary of the scattering object.

By application of boundary conditions, the above-written integral equations can always be transformed, by means known in the art, into a system matrix equation of the form:

ZJ=V where V is a known vector or matrix excitation function, Z is a calculable system matrix, and J is an unknown source vector or matrix to be determined which can represent electric and/or magnetic currents. A matrix element of Z, $Z_{ij}$, quantifies the electromagnetic interaction between a $j^{th}$ source point and an $i^{th}$ observation point. This interaction is characteristic of the object, independent of the value of the source function at the source point or the field at the observation point. Generally, a source value, $J_i$, at a source point i, depends on the excitation values, $V_j$, at many observation points, j. Stated conversely, the excitation $V_j$ at an observation point, j, depends on the source values $J_i$ at many source points, i. In the usual case, the values $V_j$ and $Z_{ij}$ can be computed and the system matrix equation is solved for each $J_i$. Once the $J_i$ are determined, the unknown fields scattered or radiated from the object may be computed directly from the integral equations given above.

For purposes of clarity we will show how the solution is obtained for the case of scattering from a perfectly conducting object. For a perfect electrical conducting object, magnetic currents and magnetic charges are zero. The boundary conditions are:

$\hat{n}\times\bar{E}=\times\hat{n}\times(\bar{E}^s+\bar{E}^i)=0$ $\hat{n}\times\bar{H}=\hat{n}\times(\bar{H}^s+\bar{H}^i)=\bar{J}$ where the tangential components of the incident fields, $n\times E^i$ and $n\times H^i$, on the surface of the body are specified. Using these results along with the continuity equation for charge conservation, the electric field integral equation above reduces to:

$$\hat{n}\times\bar{E}^i = \hat{n}\times\int\left[j\omega\mu\bar{J}\psi + \frac{j}{\omega\varepsilon}\nabla\cdot\bar{J}\nabla\psi\right]dS$$

Thus, the problem is to determine the electrical currents, J, on the body, given the tangential component of the incident electric field, $n\times E^i$, on the body. In this formulation, $n\times E^i$ is the excitation function and J is the source function.

To solve for the unknown electrical currents, the integral equation is discretized into a matrix equation. To accomplish this, the current, J, is expanded in a set of basis functions. The chosen basis functions depend on the geometry of the object and how that geometry is modeled. Thus, for example, the object may be two or three dimensional and modeled with wire mesh or with surface patches that may be rectangular or triangular. (A typical triangle basis function for surfaces is the Rao-Wilton-Glisson (RWG) basis function. This comprises two surface triangles joined by a common edge. The vector part is from the center of one triangle to the center of the second triangle and is the vector direction.). Then, the integration and differential operators can be computed on the source coordinates at each surface patch. To complete the discretization process, both sides of the integral equation are multiplied by a vector of weighting functions and integrated over the observation coordinates. These techniques outlined above are known by persons of skill in the art and the method is known generally as the Method of Moments (MOM).

As noted, the discretization of an integral equation produces a system matrix equation of the form:

ZJ=V where V is a known excitation function, Z is the system interaction matrix which can be calculated, and J is a source function to be determined. Note that the matrix Z is characteristic of the object and does not depend on the source or excitation. Once J is determined, it can be substituted into the original integral equation to solve for the scattered/radiated field. In particular, one may compute a far field disturbance arising from the sources, J. If the matrix Z were small, then J could be determined by:

$J=Z^{-1}V$

For objects of electrically moderate or large size, the matrix Z is very large. The time it takes to compute the elements of Z and to compute the inverse of Z is very long. For a problem of practical size, inverting Z could take many days even using an exceptionally fast computer. Moreover, due to limits on machine precision, the solution obtained computing the inverse is insufficiently accurate. And for many computers and problem sizes, Z is too large to be inverted at all. For these reasons, solving the equation by inverting the system interaction matrix is probably never done for any practical problem of interest.

Rather than compute the inverse of Z, an LU (lower-upper) factorization of Z can be performed, followed by a forward and back solve routine to solve for J. This requires less computational time than computing the inverse of Z and then computing J and is more accurate. The LU factorization of Z can be expressed as follows:

$$ZJ=LUJ=V$$

where L and U are lower and upper triangle matrices. For example, for a 3×3 scalar matrix:

$$\begin{bmatrix} Z_{11} & Z_{12} & Z_{13} \\ Z_{21} & Z_{22} & Z_{23} \\ Z_{31} & Z_{32} & Z_{33} \end{bmatrix} = \begin{bmatrix} 1 & 0 & 0 \\ l_{21} & 1 & 0 \\ l_{31} & l_{32} & 1 \end{bmatrix} \begin{bmatrix} u_{11} & u_{12} & u_{13} \\ 0 & u_{22} & u_{23} \\ 0 & 0 & u_{33} \end{bmatrix}$$

Note that the elements of L and U are characteristic of the object and do not depend on the source function or excitation function. The L and U elements of an n×n scalar matrix are computed as follows:

$$u_{ij} = z_{ij} - \sum_{p=1}^{i-1} l_{ip} u_{pj}$$

$$l_{ij} = \frac{1}{u_{jj}} \left( z_{ij} - \sum_{p=1}^{j-1} l_{ip} u_{pj} \right)$$

Then, the J elements are computed by:

$$x_i = v_i - \sum_{p=1}^{i-1} l_{ip} x_p \text{ (forward solve) with } i=1, 2, \ldots, n \text{ and}$$

$$j_i = \frac{1}{u_{ii}} \left( x_i - \sum_{p=i+1}^{n} u_{ip} j_p \right) \text{ (back solve) with } i = n, n-1, \ldots, 1$$

In general, the system interaction matrix may be in block format for efficiency of organization and computation where each block corresponds to a group of unknowns. For example, each submatrix may express the interaction between each part (group of unknowns) of an object with itself or with other parts (group of unknowns) of the object. For the general case of an asymmetric block matrix, the LU factorization takes the form (for a 4×4 block matrix) where each block might correspond to tens to thousands of individual unknowns:

$$\begin{bmatrix} [Z]_{11} & [Z]_{12} & [Z]_{13} & [Z]_{14} \\ [Z]_{21} & [Z]_{22} & [Z]_{23} & [Z]_{24} \\ [Z]_{31} & [Z]_{32} & [Z]_{33} & [Z]_{34} \\ [Z]_{41} & [Z]_{42} & [Z]_{43} & [Z]_{44} \end{bmatrix} \begin{bmatrix} [J]_1 \\ [J]_2 \\ [J]_3 \\ [J]_4 \end{bmatrix} = \begin{bmatrix} I & 0 & 0 & 0 \\ [L]_{21} & I & 0 & 0 \\ [L]_{31} & [L]_{31} & I & 0 \\ [L]_{41} & [L]_{41} & [L]_{41} & I \end{bmatrix}$$

$$\begin{bmatrix} [U]_{11} & [U]_{12} & [U]_{13} & [U]_{14} \\ 0 & [U]_{22} & [U]_{23} & [U]_{24} \\ 0 & 0 & [U]_{33} & [U]_{34} \\ 0 & 0 & 0 & [U]_{44} \end{bmatrix}$$

$$\begin{bmatrix} [J]_1 \\ [J]_2 \\ [J]_3 \\ [J]_4 \end{bmatrix} = \begin{bmatrix} [V]_1 \\ [V]_2 \\ [V]_3 \\ [V]_4 \end{bmatrix}$$

where each $Z_{ij}$, is a matrix containing the terms of interaction between an ith source block (group of unknowns) and a jth observation block (group of unknowns). Note that the V and J may be matrices corresponding to multiple excitation vectors V and corresponding multiple source vectors J. For example, in monostatic scattering problems, one desires to determine J for each of a plurality of excitations, V. The factors L and U are determined as follows:

$$U_{ij} = Z_{ij} - \sum_{p=1}^{i-1} L_{ip} U_{pj}$$

$$L_{ij} = Dinv_{jj} \left( z_{ij} - \sum_{p=1}^{j-1} L_{ip} U_{pj} \right)$$

The forward solution for the blocks of $Y_i$, with i=1, 2, ..., n is:

$$Y_i = V_i - \sum_{j=1}^{i-1} L_{ij} Y_j$$

and the back solution for the blocks of $J_i$, with i=n, n−1, ..., 1 is:

$$J_i = Dinv_{ii} \left( Y_i - \sum_{j=i+1}^{n} U_{ij} J_j \right)$$

Note that diagonal block $D^{-1}{}_{ii} = U^{-1}{}_{ii}$ can be computed by LU factorization, rather than by matrix inverse.

For a symmetric block of Z submatrices, Z can be factored as follows:

$$Z=U'^T D U'.$$

For example, consider:

$$\begin{bmatrix} Z_{11} & Z_{12} & Z_{13} \\ Z_{12}^T & Z_{22} & Z_{23} \\ Z_{13}^T & Z_{23}^T & Z_{33} \end{bmatrix} = \begin{bmatrix} 1 & 0 & 0 \\ U'^T_{12} & 1 & 0 \\ U'^T_{13} & U'^T_{23} & 1 \end{bmatrix} \begin{bmatrix} D_{11} & 0 & 0 \\ 0 & D_{22} & 0 \\ 0 & 0 & D_{33} \end{bmatrix} \begin{bmatrix} 1 & U'_{12} & U'_{13} \\ 0 & 1 & U'_{23} \\ 0 & 0 & 1 \end{bmatrix}$$

where each $Z_{ij}$ is a submatrix of Z. The diagonal entries of U' are unity. The matrices $D_{ii}$ are the on-diagonal matrices shown below. Putting U'$^T$DU' into LU form, we first expand DU' to obtain the form $$\begin{bmatrix} Z_{11} & Z_{12} & Z_{13} \\ Z_{12}^T & Z_{22} & Z_{23} \\ Z_{13}^T & Z_{23}^T & Z_{33} \end{bmatrix} = \begin{bmatrix} 1 & 0 & 0 \\ U'^T_{12} & 1 & 0 \\ U'^T_{13} & U'^T_{23} & 1 \end{bmatrix} \begin{bmatrix} D_{11} & D_{11}U'_{12} & D_{11}U'_{13} \\ 0 & D_{22} & D_{22}U'_{23} \\ 0 & 0 & D_{33} \end{bmatrix}$$

Making the substitutions $U_{ij} = D_{ii}U'_{ij}$ $U_{ii} = D_{ii}$ $L_{ij} = U'^T_{ji} = [D_{ii}^{-1}U_{ij}]^T = U_{ji}^T D_{ii}^{-1}$ we arrive at the standard LU form $$\begin{bmatrix} Z_{11} & Z_{12} & Z_{13} \\ Z_{12}^T & Z_{22} & Z_{23} \\ Z_{13}^T & Z_{23}^T & Z_{33} \end{bmatrix} = \begin{bmatrix} 1 & 0 & 0 \\ L_{21} & 1 & 0 \\ L_{31} & L_{31} & 1 \end{bmatrix} \begin{bmatrix} U_{11} & U_{12} & U_{13} \\ 0 & U_{22} & U_{23} \\ 0 & 0 & U_{33} \end{bmatrix}$$

with factorization $$U_{ij} = Z_{ij} - \sum_{p=1}^{i-1} U_{ip}^T D_{pp}^{-1} U_{pj}$$

and solve $$X_i = V_i - \sum_{p=1}^{i-1} U_{ip}^T D_{pp}^{-1} X_p; \quad \text{Forward}$$

$$J_i = D_{ii}^{-1}\left(X_i - \sum_{p=i-1}^{1} U_{ip} J_p\right); \quad \text{Back}$$

which completes the block symmetric matrix LU factor and solve expressions. Note that the inverse terms $D_{ii}^{-1}$ can be determined using LU factorization so that the inverse need not be computed directly.

Thus, LU factorization may be performed instead of a direct matrix inverse to solve the system matrix equation ZJ=V. However, although LU factorization of the system matrix equation is faster and more accurate than direct inversion of the system matrix, Z, determining the elements of Z and performing the LU factorization still takes a large amount of time (days) for objects that are electrically moderate or large in size and also requires large amounts of memory.

Indeed, for many electrically large objects of practical interest, the solutions outlined above exceed the capacity of most if not all computing systems.

In recent years, another method has been developed for solving the system matrix equation ZJ=V. This method involves three basic steps: (1) spatially grouping the unknown sources, J, (2) computing a compressed form of the system interaction matrix, Z, and (3) performing iterative solutions to solve for J. This method avoids both matrix inversion and LU factorization, and further, compressing blocks of Z reduces the number of elements of each Z block that must be computed and stored. The method exploits the fact that when the unknowns are spatially grouped, then off-diagonal sub-matrix blocks of Z are rank deficient and can be well approximated by low rank matrices, typically in outer product form. This means that the interaction physics contained in a Z matrix block describing the interaction of a group of, for example, 3000 unknowns with a distant group of 3000 unknowns is a block matrix of 3000×3000 (9 million complex numbers) and can be expressed with far fewer numbers. Mathematically, this 3000×3000 block is rank deficient and can be approximated with a low rank matrix of outer product form with significantly less memory storage. Moreover, since the currents are solved iteratively, a full matrix inversion or LU factorization need not be performed.

Spatial grouping of unknowns involves ordering unknowns according to distance between a point selected as a reference point and other points on the object. This results in a system matrix with rank deficient block submatrices. The blocks furthest from the diagonal of the system matrix are generally the blocks of maximum deficiency. Because the blocks are rank deficient, they may be computed in a compressed form. One method of computing blocks of a matrix Z in low rank outer product form is described in: Mario Bebendorf, "Approximation of boundary element matrices," Numer. Math. (2000) 86:565:589, which is referred to herein by reference to "Bebendorf" for all purposes. This method, known as the Adaptive Cross Approximation (ACA) technique, is also described in: Stefan Kurz, "The Adaptive Cross-Approximation Technique for the 3-D Boundary-Element Method," IEEE Transactions on Magnetics, Vol. 38, No. 2, March 2002, which is referred to herein by reference to "Kurz" for all purposes.

The ACA technique may be outlined as follows. Consider a matrix A to be approximated with a low rank outer product of Au times Av where Au is a column dominant matrix and Av is a row dominant matrix. Any row or column of A can be computed from a subroutine, GetRowOrColumn. Thus, an arbitrary row of A is first computed. This row is a pivot row, kRowPivot, $u_0$. Then select the column of this row containing the largest element. Call this column kColPivot. Now compute the kColPivot $v_0$ column from the subroutine GetRowOrColumn. Divide the col, $v_0$, by its largest element, so that all the elements of row $v_0$ are now unity or less. The outer product, $u_ov_o$, is the first approximation to the matrix, A, $A_0=u_0v_0$. Let an error matrix be $E_0=A-A_0$. The next row and column approximation, $u_1$, $v_1$ is computed, just as described for $u_0$, $v_0$, from the error matrix, $E_0$, and the next approximation is $A_1=u_ov_o+u_1v_1$. The next error matrix is $E_1=A-A_1$. Thus, the process is continued until the error matrix is sufficiently small. If k terms are needed for convergence, the k $u_k$ column vectors comprise the matrix Au and the k row vectors $v_k$ comprise the Av matrix. If the matrix A is rank deficient, k will be much less than m or n original dimensions of matrix A.

Thus, using ACA, a low rank outer product approximant form for rank deficient A can be computed as:

[A_c]=[Au][Av]

where Au and Av are column and row dominant matrices, respectively of size (m×k) and (k×n). The vectors u and v comprising Au and Av are computed recursively using the method described in Bebendorf as shown in Kurz. Bebendorf has shown that to compute this approximation to A, only k rows and columns of A are needed. If A can be approximated with k <<(m or n), then a significant reduction in matrix fill time can be accomplished. Thus, compression results from the fact that only a relatively small number of rows and columns of A need to be computed to obtain the resultant compressed matrix, $A_c$. A measurement of the error can be obtained as:

$$\frac{\|A_c(k) - A\|}{\|A\|} \leq \varepsilon \quad (2)$$

If matrix $A_c$=Au Av represents A to this tolerance, we say that A has rank k for tolerance $\varepsilon$. Computing only a relatively small number of rows and columns of A, this tolerance error can be on the order of $10^{-4}$, for example.

In this method, when the compressed form of a Z block is computed as ZuZv, the solution for J is computed iteratively. In the iterative process, a first approximation, $J_1$, is substituted into the matrix equation and the resultant excitation, $V_1$, is computed. An error vector $e=V-V_1$ is computed. This error is used to compute a second, hopefully more accurate, approximation, $J_2$, and the process is repeated. This continues until the error becomes sufficiently small. Methods for implementing iterative solutions are well known in the art.

Several problems exist with the compression and iterative solve method just described. First, although the method of computing a compressed system matrix is substantially faster computation the full system interaction matrix, computation of the iterative solution still takes a very long time for problems of practical interest. Second, for many problems of practical interest, the iterative solution converges very, very slowly or not at all, such as for cavities which are of great interest in stealth design problems. And for each RHS (right hand side) vector V a new iterative process must be done. For backscatter problems for electrically large bodies with many RHS to describe the pattern, iterative approaches require an inordinate number of RHS.

Thus, all of the above-described methods for solving a system matrix equation have the limitation that computational time is excessively long and required memory storage is excessively large. What is needed is a method that substantially reduces computation time and memory storage while producing accurate results.

BRIEF DESCRIPTION OF THE DRAWINGS

Advantages of the invention will become apparent upon reading the following detailed description and upon reference to the accompanying drawings in which, like references may indicate similar elements.

DETAILED DESCRIPTION OF EMBODIMENTS

Figure 1:
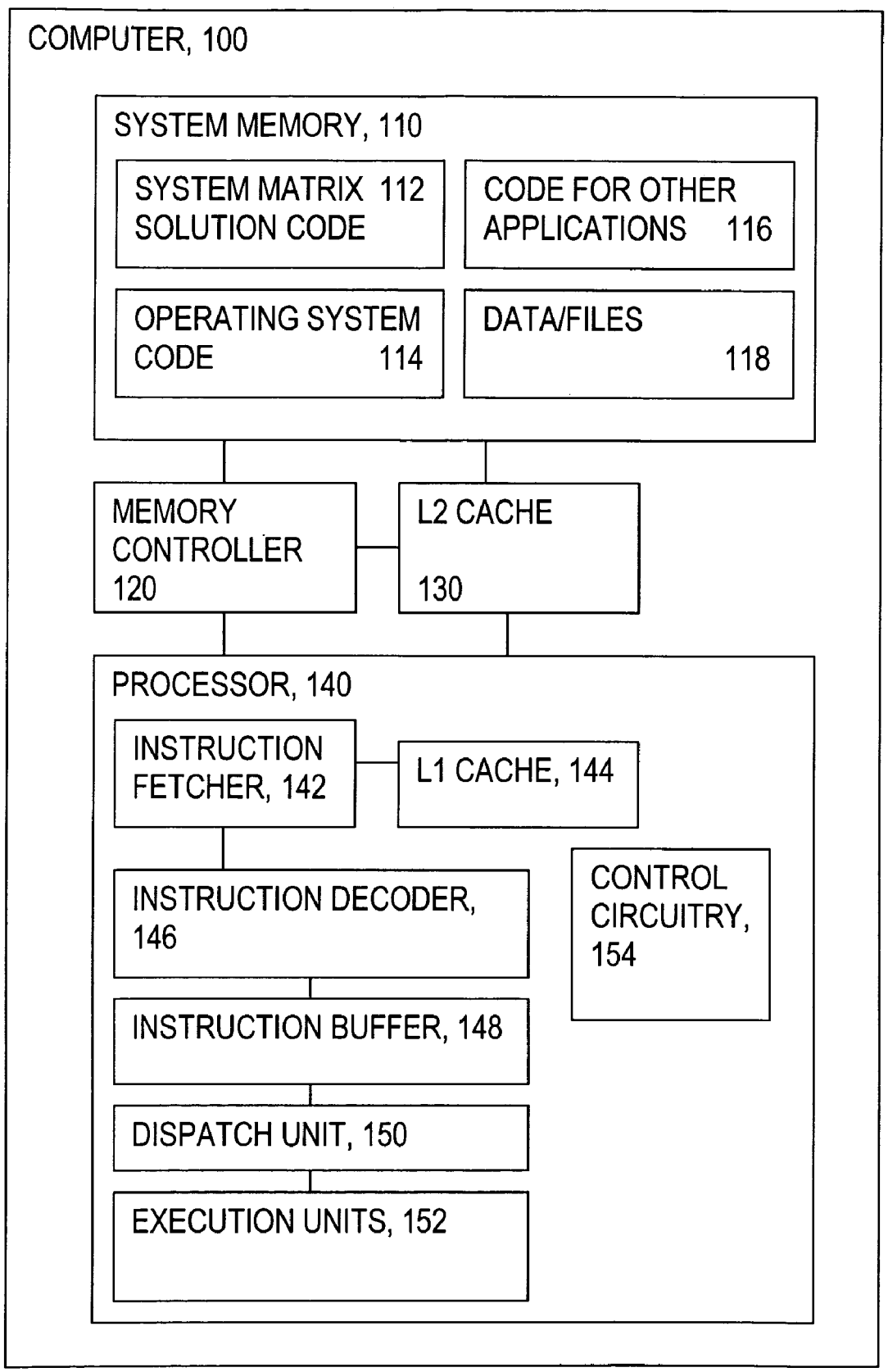
FIG. 1 depicts a block diagram of a computer for solving a system matrix equation according to the methods described herein.

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed description below is designed to render various embodiments obvious to a person of ordinary skill in the art.

Methods and apparatus for analysis and design of radiation and scattering objects are disclosed. In one embodiment, unknown sources are spatially grouped to produce a system interaction matrix with rank deficient block factors which can be well approximated with low rank outer product form matrices within a given error tolerance. The unknown sources are determined from compressed forms of the factors.

Methods and apparatus of the present invention exploit the fact that when unknowns are spatially grouped, not only is the system interaction matrix blocks Zij (i and j refer to blocks) of rank deficient, the L and U block factors in the LU factorization of Z are also rank deficient and can therefore be computed in compressed form. This results in a reduction of computational time and memory storage that is much, much greater than the methods described above. Moreover, in the case of monostatic scattering problems, the excitation matrix V blocks and the source function matrix J blocks are also rank deficient and can be computed in compressed form, resulting in a further substantial reduction in computation time and memory storage.

For ease of reference, the formulas for computing the LU block factors of an asymmetric Z block system interaction matrix are repeated here.

$$U_{ij} = Z_{ij} - \sum_{p=1}^{i-1} L_{ip} U_{pj}$$

$$L_{ij} = Dinv_{jj}\left(Z_{ij} - \sum_{p=1}^{j-1} L_{ip} U_{pj}\right)$$

The forward solution for the blocks of $Y_i$, with i=1, 2, . . . , n is:

$$Y_i = V_i - \sum_{j=1}^{i-1} L_{ij} Y_j$$

and the back solution for the blocks of $J_i$, with i=n, n−1, . . . , 1 is:

$$J_i = Dinv_{ii}\left(Y_i - \sum_{j=i+1}^{n} U_{ij} J_j\right)$$

Substantial reduction in operations count and memory storage can be achieved if the LU factorization is computed in compressed outer product UV form and using a method such as an adaptive cross approximation to compute the compressed form. For LU compressed block factorization we have:

$$([Uu][Uv])_{ij} = ([Zu][Zv])_{ij} - \sum_{p=1}^{i-1} ([Lu][Lv])_{ip}([Uu][Uv])_{pj}$$

$$([Lu][Lv])_{ij} = Dinv_{jj}\left(([Zu][Zv])_{ij} - \sum_{p=1}^{j-1} ([Lu][Lv])_{ip}([Uu][Uv])_{pj}\right)$$

and for the forward/back solve:

$$([Yu][Yv])_i = ([Vu][Vv])_i - \sum_{j=1}^{i-1} ([Lu][Lv])_{ij}([Yu][Yv])_j$$

$$([Ju][Jv])_i = Dinv_{ii}\left(([Yu][Yv])_i - \sum_{j=i+1}^{n} ([Uu][Uv])_{ij}([Ju][Jv])_j\right)$$

Thus, the system matrix equation is solved for the unknown sources, J, by expressing the factorization in low rank outer product compressed form. Note that computation of LU factors in compressed form can also be done for the case of symmetric Z.

In the above-given formulas, where spatial block $Z_{ij}$ is needed, one computes instead:

$$[Zu][Zv]_{ij}$$

That is, one computes the compressed form of block $Z_{ij}$ using only k rows and columns of $Z_{ij}$. The full block matrix $Z_{ij}$ is never computed. The $Z_{ij}$ blocks are the electrical interaction between the $i^{th}$ and $j^{th}$ spatially grouped unknowns. These $Z_{ij}$ are low rank, with rank fraction decreasing as distance between the $i^{th}$ and $j^{th}$ group increases, i.e., as the $Z_{ij}$ blocks get further from the diagonal. These $Z_{ij}$ blocks have been observed to be up to 99% sparse for electrically large problems. Because these Z blocks are low rank, they can be compressed to the outer product [Zu] [Zv] form. And this form can be computed from a Z fill subroutine using the Adaptive Cross Approximation resulting in significantly less memory storage for $([Zu] [Zv])_{ij}$ and significantly less computational time since only a few rows and columns of $Z_{ij}$ must be computed by the ACA algorithm to compute $([Zu] [Zv])_{ij}$. The diagonal blocks $Z_{ii}$ are the interaction of the $i^{th}$ group with itself. These blocks are generally not low rank, not sparse, and not able to be compressed.

The $L_{ij}$ and $U_{ij}$ lower/upper block matrix factors are also low rank, but not as low rank as the blocks of Z. Even so, for electrically large bodies, these $L_{ij}$ and $U_{ij}$ blocks have been observed to be 90 to 98% sparse. Thus, the L and U blocks have a low rank fraction, which is the ratio of storage required in compressed form to storage required for the full matrix:

$$RF = k(m+n)/mn$$

where k is the rank of the block within error tolerance $\epsilon$ and the full block matrix is of dimension m×n. This shows that a substantial reduction in memory is achieved for storing the matrix in compressed form. A most efficient approach for the ACA algorithm to compute a low rank approximant (on the left hand side of the equal sign is for all terms of the known right hand side to be expressed in outer product form. This allows minimum memory storage and, more importantly, minimum number operations count for computing the few ACA required rows and columns as shown below.

The rank deficient property of these LU blocks means that each can be well approximated by the low rank [Lu][Lv] and [Uu][Uv] outer product form. Thus, the Uu Uv blocks can be computed using the ACA algorithm after initializing the above equation into the column/row matrix outer product form on the right hand side of the =sign:

$$([Uu][Uv])_{ij} = ([Zu][Zv])_{ij} - \sum_{p=1}^{i-1} ([Lu][Lv])_{ip}([Uu][Uv])_{pj}$$

$$([Uu][Uv])_{ij} = ([Zu][Zv])_{ij} - \sum_{p=1}^{i-1} ([Su][Sv])_{ij,p}$$

$$= \begin{bmatrix} Zu \end{bmatrix}[Zv\ ] - \sum_{p=1}^{i-1} \begin{bmatrix} Su \end{bmatrix}[Sv\ ]$$

This form is then used by the ACA subroutine to compute the left side $([Uu][Uv])_{ij}$ outer product (compressed) form. This is an inexpensive computation as the ACA needs only a few rows/columns of the terms of the matrices on the right hand side of the =sign. How this is done is shown below. The S matrix compressed terms can be expressed as $$[Su] = -[Lu];\ \begin{bmatrix} Su \end{bmatrix} = \begin{bmatrix} Lu \end{bmatrix}$$

$$Sv = [Lv][Uu][Uv] = \left([Lv\ ]\begin{bmatrix} Uu \end{bmatrix}\right)[Uv\ ] = [Sv\ ]$$

One computes Sv in an inner product manner shown by the brackets to minimize the matrix multiply operations count. The lower triangle Lu Lv blocks are similarly computed, $$([Lu][Lv])_{ij} = Dinv_{jj}\left\{([Zu][Zv])_{ij} - \sum_{p=1}^{j-1} ([Lu][Lv])_{ip}([Uu][Uv])_{pj}\right\}$$

$$= \left\{(Dinv_{jj}[Zu][Zv])_{ij} - \sum_{p=1}^{j-1} ([Su][Sv])_{ij,p}\right\}$$

$$= \left\{[Dinv_{jj}]\begin{bmatrix} Zu \end{bmatrix}[Zv\ ] - \sum \begin{bmatrix} Su \end{bmatrix}[Sv\ ]\right\}$$

$$\left\{\begin{bmatrix} SZu \end{bmatrix}[Zv\ ] - \sum \begin{bmatrix} Su \end{bmatrix}[Sv\ ]\right\}$$

The term inside the curly brackets may be computed using ACA in the manner described below. The S matrix compressed terms can be expressed as before:

$$[Su] = [Dinv_{jj}][Lu];\ \begin{bmatrix} Su \end{bmatrix} = [Dinv_{jj}]\begin{bmatrix} Lu \end{bmatrix}$$

$$Sv = [Lv][Uu][Uv] = \left([Lv\ ]\begin{bmatrix} Uu \end{bmatrix}\right)[Uv\ ] = [Sv\ ]$$

And one computes Sv in the inner product like manner shown by the brackets to minimize the matrix multiply operations count.

Finally, for the forward/back solve, the blocks of the RHS (right hand side) voltage matrix, [Vv][Vu], which may have many columns for monostatic cases, can be computed in compressed form using the ACA. (This is not true for bistatic scattering and antenna problems as they typically have only one or a few RHS V vectors) The ACA is then used to compute the forward/back solve $$([Yu][Yv])_i = ([Vu][Vv])_i - \sum_{j=1}^{i-1} ([Lu][Lv])_{ij} ([Yu][Yv])_j$$

This may done by computing full blocks $Y_i$ of this expression and then compressing with the ACA to obtain [Yu][Yv] or by using the ACA to compute the sum from:

$$([Yu][Yv])_i = ([Vu][Vv])_i - \sum_{j=1}^{i-1} ([Su][Sv])_{ij}$$

$$= \begin{bmatrix} Vu \\ \end{bmatrix} [\ Vv\ ] - \sum_{j=1}^{i-1} \begin{bmatrix} Su \\ \end{bmatrix} [\ Sv\ ]$$

where [Su][Sv] again has the form $$[Su] = [Lu]; \quad \begin{bmatrix} Su \\ \end{bmatrix} = \begin{bmatrix} Lu \\ \end{bmatrix}$$

$$Sv = [Lv][Lu][Yv] = \left( [\ Lv\ ] \begin{bmatrix} Yu \\ \end{bmatrix} \right) [\ Yv\ ] = [\ Sv\ ]$$

The back solve for the final block compressed currents, [Ju][Jv] using ACA is similar. Starting with $$([Ju][Jv])_i = Dinv_{ii} \left( ([Yu][Yv])_i - \sum_{j=i+1}^{n} ([Uu][Uv])_{ij} ([Ju][Jv])_j \right)$$

One can compute full blocks J of the right hand side using inner product matrix multiplies to reduce operations count and then compress using the ACA to store [Ju][Jv]. Alternately, the right hand side can use the ACA to compute [Ju][Jv] form directly from $$([Ju][Jv])_i = Dinv_{ii}([Qu][Qv])_i$$

where [Qu][Qv] is ACA computed from:

$$([Qu][Qv])_i = ([Yu][Yv])_i - \sum_{j=i+1}^{n} ([Su][Sv])_{ij}$$

$$= \begin{bmatrix} Yu \\ \end{bmatrix} [\ Yv\ ] - \sum_{j=i+1}^{n} \begin{bmatrix} Su \\ \end{bmatrix} [\ Sv\ ]$$

with $$[Su] = [Uu]; \quad \begin{bmatrix} Su \\ \end{bmatrix} = \begin{bmatrix} Uu \\ \end{bmatrix}$$

$$Sv = [Uv][Ju][Jv] = \left( [\ Uv\ ] \begin{bmatrix} Ju \\ \end{bmatrix} \right) [\ Jv\ ] = [\ Sv\ ]$$

The LU compressed factorization formulas and the solve forward/back formulas involve a sum of matrix block terms expressed in compressed form. In general one could compute a full block matrix and then compress. However, this is very wasteful for operations count. The ACA can be used to compute these low rank blocks from a column/row compressed form as follows. Suppose one wants to compute:

$$[Au][Av] = [Bu][Bv] - \sum_{p=1}^{k} ([Su][Sv])_p$$

where all terms on the right hand side are already known. This expression rewritten in slightly expanded form is $$\left( \begin{bmatrix} Bu \\ \end{bmatrix} [\ Bv\ ] \right) - \sum_{p=1}^{k} \left( \begin{bmatrix} Su \\ \end{bmatrix} [\ Sv\ ] \right)_p$$

Using the ACA algorithm, to compute [Au Av] needs rows/columns of this expression. This is an easy, cheap computation. Bu and Bv are already in compressed form (typically from the Z or V matrix subroutines). Su and Sv are made up of compressed matrices for the type of computation being computed as suggested above. Computation of Sv is always done in an inner product operations count form. The ACA algorithm, in order to compute the left hand side [Au][Av], needs rows and columns of the expression on the right hand side. These are computed from this outer product form. Symbolically, a row is computed as $$S_{i,:} = [\ S_i\ ] = [Su]_{ip}[Sv]_{p,:} = \begin{bmatrix} i \rightarrow \\ \end{bmatrix} [\downarrow\ \downarrow\ \downarrow\ \downarrow]$$

and a column as $$S_{:,j} = \begin{bmatrix} S_: \\ \end{bmatrix} = [Su]_{:,p}[Sv]_{p,j} = \begin{bmatrix} \rightarrow \\ \rightarrow \\ \rightarrow \\ \rightarrow \end{bmatrix} [\ j\downarrow\ ]$$

This approach can significantly reduce the operations count required to compute [Au][Av].

Thus, one embodiment is a computer-implemented method for determining the unknown physical sources of an object given an excitation of the object that produces the sources, where the object has associated therewith a system interaction matrix, Z, that is characteristic of the object and that depends on the object's geometry. The method comprises determining source locations from a geometry of the object and ordering and grouping the source locations according to their distance from each other so that factors of the system interaction matrix can be approximated by blocks of low rank. The method comprises logically partitioning the system interaction matrix into 9 or more blocks, $Z_{ij}$, so that the diagonal blocks are square and a dimension of a block corresponds to a number of unknown source locations in a group, the logical partition created without computing $Z_{ij}$. The method further comprises, for the partition chosen, computing terms of a Lower Upper (LU) factorization of the partitioned system interaction matrix, wherein the LU factors have the following relationship:

$$U_{ij} = Z_{ij} - \sum_{p=1}^{i-1} L_{ip} U_{pj}$$

$$L_{ij} = Dinv_{jj}\left(Z_{ij} - \sum_{p=1}^{j-1} L_{ip} U_{pj}\right) \quad i, j-1, 2, \ldots, n > 2$$

The terms of the L and U blocks of this factorization are computed and stored in a compressed outer product form and $Dinv_{jj}$ are computed by LU factorization. The method also comprises determining the physical sources, $J_i$ from terms of the compressed L and U factors, wherein the physical sources and the excitations, $V_i$, have the following relationship:

$$Y_i = V_i - \sum_{j=1}^{i-1} L_{ij} Y_j \quad i = 1, 2, \ldots, n$$

$$J_i = Dinv_{ii}\left(Y_i - \sum_{j=i+1}^{n} U_{ij} J_j\right) \quad i = n, n-1, \ldots, 1$$

For monostatic scattering (backscatter), one usually computes a pattern over an angular sweep so that the right hand side (RHS) V is composed of incident plane waves. As body size increases, the angle between incident plane waves must get smaller so as to adequately sample the increasingly narrow peaks and nulls of the backscatter pattern. This dramatically increases the number of RHS V vectors required for electrically large bodies to compute the pattern. In addition, at each angle, one usually excites the body with two polarizations, (theta,phi). In backscatter cases with electrically large bodies and many closely spaced (in angle) plane waves, the RHS V blocks become sparse, hence compressible and hence able to be computed (filled) using the Adaptive Cross Approximation. V has been observed to be 95% sparse. This saves significant memory storage for V since only [Vu] [Vv] is required and time for filling is reduced. The resulting current solution blocks J are also low rank, compressible and thus ACA can be used to aide in the LU solve part of the algorithm thus reducing solve (forward and back) operations count and memory. J in compressed form is [Ju][Jv]. J has been observed to be 85% sparse. Finally, the backscatter polarization scattering matrix at each angle is computed from the standard row current matrix form, except now the matrix algebra is in compressed format, thus again, significantly reducing the operations count for this final part of the problem.

$$\begin{bmatrix} \sqrt{\sigma^{\theta\theta}} & \sqrt{\sigma^{\theta\phi}} \\ \sqrt{\sigma^{\phi\theta}} & \sqrt{\sigma^{\phi\phi}} \end{bmatrix} = [R][J] = [V]^T[J] = [Vv]^T[Vu]^T[Ju][Jv]$$

where Vv and Vu are the compressed backscatter incident voltage block matrices (for both polarizations) and Ju and Jv are the block wise compressed solution for both polarizations.

The overall impact of low rank, compressed matrix storage and use of the Adaptive Cross Approximation to compute compressed LU factors of the system matrix equation has allowed problem sizes up to one million unknowns to be computed using PC Workstation class computers with memory savings factors of 40 and operations count savings factors of 2500. This greatly exceeds the efficiency of prior art methods outlined above. Moreover, the inventive methods described herein reduce computational time and memory storage to the extent that a problem of over one million unknowns can be solved on a PC workstation class computer in about 100 wall clock hours Also more recently, a 2 million unknown problem with nearly 10,000 right hand side illumination functions was solved on a $1200 PC computer.

Note that the above described method applies equally well not only to the Electric Field Integral Equation (EFIE), but also to the Magnetic Field Integral Equation (MFIE) and the Combined Field Integral Equation (CFIE). One, two and three dimensional problems may be solved. Basis functions may include wire mesh segments, rectangular, azimuthal basis functions for bodies of revolution, or triangular basis functions or other basis functions. Moreover, the method applies to any Method of Moments (MOM) formulation that relates a source function to an excitation function, such as occurs in the case of acoustic disturbances, that involves solution of a system matrix equation which can be expressed in blocked form with blocks that are low rank. Note also that although the ACA is used as the compression technique, other compression techniques may be employed.

Note that once the sources J are determined, the sources may be used in a variety of ways to aid in understanding the reaction of the object to an excitation and how to design the object to alter its radiation or scattering pattern. Most often, the far field radiation/scattering pattern is computed. Other uses for J include computing near fields about the object and computing radiation images to locate "hot" spots of scattering. Also, the current sources can be plotted as a function of position on the object. For example, the sources may be plotted on an image of the object in 3-D perspective view. The magnitudes and directions of the sources can be illustrated and color can be used to show source magnitude as a function of position. This can show where the current sources are strong or weak. This greatly aids the design engineer to determine how to alter the object to reduce or increase source strength at certain positions on the object, which in turn will alter its radiation or scattering pattern. Thus, the sources J can be used directly to aid in design.

The sources J can also be used to plot a down range image and a cross range image. A down range image shows scattered or radiated fields as a function of range in a specified direction, and a cross range pattern shows scattered or radiated fields as a function of cross range in a direction perpendicular to the specified direction. This enables the designer to see what parts of the body contribute the most to a scattered or radiated field. The sources J can also be used to compute a far field scattering or radiation pattern which can be plotted as a function of angular deviation from a reference line. For an antenna problem, the antenna can be excited at its terminals by an excitation V, the resulting currents J can be determined, and used to determine the radiation pattern of the antenna as a function of spherical angles, theta and phi. For a bistatic scattering problem, a plane wave V is incident upon the object at a particular angle, and the resulting currents J are used to determine the scattered field at a discrete set of angles about the object. For a monostatic scattering problem, a plurality of incident waves V are used to determine a plurality of resultant currents J, and from the resultant currents, a backscatter value is determined for each incident wave. For bistatic and monostatic cases, not only can the far fields be determined but the radar cross section of the object can also be determined. The sources J can also be used to compute a near field radiation or scattering pattern. The projection of the near field onto a sphere closely surrounding the object can be computed to show radiation or scattering hot points. All of these uses of the determined sources J can be used to aid in the design of an object to alter its radiation or scattering pattern. Moreover, since the present invention allows for faster computation of the sources J using less wall clock time and much much less computer resources, larger objects can be analyzed and redesigned much faster, i.e., much greater exploration of design space is possible. The quite significant cost reduction in computer resources is also obvious.

Thus, embodiments provide a method for determining a source function given an excitation of an object having a characteristic system interaction matrix. The method comprises spatially grouping unknown sources of the source function according to their distances from one or more reference points so that the characteristic system interaction matrix blocks can be well approximated by low rank matrices for a given error tolerance. The method further comprises computing a compressed block LU factorization of the system interaction matrix, and determining the source function from the compressed factorization. The method may further comprise determining a compressed form of multiple excitation functions and a compressed form of multiple source functions each of the multiple source functions corresponding to an excitation function. The compressed forms of the excitation functions and source functions may be determined from an adaptive cross approximation. Once a source function is determined the method may comprise determining a far field disturbance from the source function.

FIG. 1 shows a block diagram of a computer 100 to implement the inventive methods described herein. Computer 100 comprises a system memory 110, a memory controller 120, an L2 cache 130, and a processor 140. System memory 110 comprises a hard disk drive memory, Read-Only Memory (ROM), and Random Access Memory (RAM). System memory 110 stores system matrix equation solution code 112, Operating System (OS) code 114, Basic Input-Output System (BIOS) code (not shown), and code for other application programs 116. System memory 110 also stores data and files 118. The system matrix equation solution code 112, OS code 114, and other applications code 116, are typically stored on a hard drive, whereas BIOS code is typically stored in ROM.

Memory controller 120 effectuates transfers of instructions and data from system memory 110 to L2 cache 130 and from L2 cache 130 to an L1 cache 144 of processor 140.

Thus, data and instructions are transferred from a hard drive to L2 cache near the time when they will be needed for execution in processor 140. L2 cache 130 is fast memory located physically close to processor 140. Instructions may include load and store instructions, branch instructions, arithmetic logic instructions, floating point instructions, etc. L1 cache 144 is located in processor 140 and contains data and instructions received from L2 cache 130. Ideally, as the time approaches for a program instruction to be executed, the instruction is passed with its data, if any, first to the L2 cache, and then as execution time is near imminent, to the L1 cache.

In addition to on-chip level 1 (L1) cache 144, processor 140 also comprises an instruction fetcher 142, instruction decoder 146, instruction buffer 148, a dispatch unit 150, execution units 152 and control circuitry 154. Instruction fetcher 142 fetches instructions from memory. Instruction fetcher 142 maintains a program counter and fetches instructions from L1 cache 144. The program counter of instruction fetcher 142 comprises an address of a next instruction to be executed. Instruction fetcher 142 also performs pre-fetch operations. Thus, instruction fetcher 142 communicates with a memory controller 120 to initiate a transfer of instructions from the system memory 110, to instruction cache L2 130, and to L1 instruction cache 144. The place in the cache to where an instruction is transferred from system memory 110 is determined by an index obtained from the system memory address.

Instruction fetcher 142 retrieves instructions passed to instruction cache 144 and passes them to an instruction decoder 146. Instruction decoder 146 receives and decodes the instructions fetched by instruction fetcher 142. An instruction buffer 148 receives the decoded instructions from instruction decoder 146. Instruction buffer 148 comprises memory locations for a plurality of instructions. Instruction buffer 148 may reorder the order of execution of instructions received from instruction decoder 146. Instruction buffer 148 therefore comprises an instruction queue to provide an order in which instructions are sent to a dispatch unit 150.

Dispatch unit 150 dispatches instructions received from instruction buffer 148 to execution units 152. In a superscalar architecture, execution units 152 may comprise load/store units, integer Arithmetic/Logic Units, floating point Arithmetic/Logic Units, and Graphical Logic Units, all operating in parallel. Dispatch unit 150 therefore dispatches instructions to some or all of the executions units to execute the instructions simultaneously. Execution units 152 comprise stages to perform steps in the execution of instructions received from dispatch unit 150. Data processed by execution units 152 are storable in and accessible from integer register files and floating point register files not shown. Thus, instructions are executed sequentially and in parallel.

FIG. 1 also shows control circuitry 154 to perform a variety of functions that control the operation of processor 140. For example, an operation controller within control circuitry 154 interprets the OPCode contained in an instruction and directs the appropriate execution unit to perform the indicated operation. Also, control circuitry 154 may comprise a branch redirect unit to redirect instruction fetcher 142 when a branch is determined to have been mispredicted. Control circuitry 154 may further comprise a flush controller to flush instructions younger than a mispredicted branch instruction. Computer 100 further comprises other components and systems not shown in FIG. 1, including, RAM, peripheral drivers, a system monitor, a keyboard, flexible diskette drives, removable non-volatile media drives, CD and DVD drives, a pointing device such as a mouse, etc. Computer 100 may be a personal computer, a workstation, a server, a mainframe computer, a notebook or laptop computer, etc.

Thus, one embodiment is a computer for determining sources on an object in response to an excitation. The computer comprises memory to store a geometry of the object and locations of the sources. The memory further stores terms of compressed forms of an LU block factorization of a system interaction matrix that is characteristic of the object. The memory further stores excitations and sources. The L and U factors have the following relationship $$U_{ij} = Z_{ij} - \sum_{p=1}^{i-1} L_{ip} U_{pj}$$

$$L_{ij} = Dinz_{jj}\left(Z_{ij} - \sum_{p=1}^{j-1} L_{ip} U_{ip}\right) \quad i, j = 1, 2, \ldots, n > 2$$

The terms of the L and U blocks of this factorization are computed and stored in a compressed outer product form where $Dinv_{jj}$ are computed by LU factorization. The computer further comprises a processor to compute a grouping and ordering of unknown sources so that factors of the system interaction matrix can be approximated by blocks of low rank. The processor computes a logical partitioning of the system interaction matrix into 9 or more blocks, $Z_{ij}$, so that diagonal blocks are square and a dimension of a block corresponds to a number of unknown sources in a group. The processor computes, for the partition, terms of the L and U factors of the LU block factorization of the system interaction matrix, wherein terms of the L and U blocks are computed and stored in a compressed outer product form. The processor computes the sources from the compressed L and U blocks.

Figure 2:
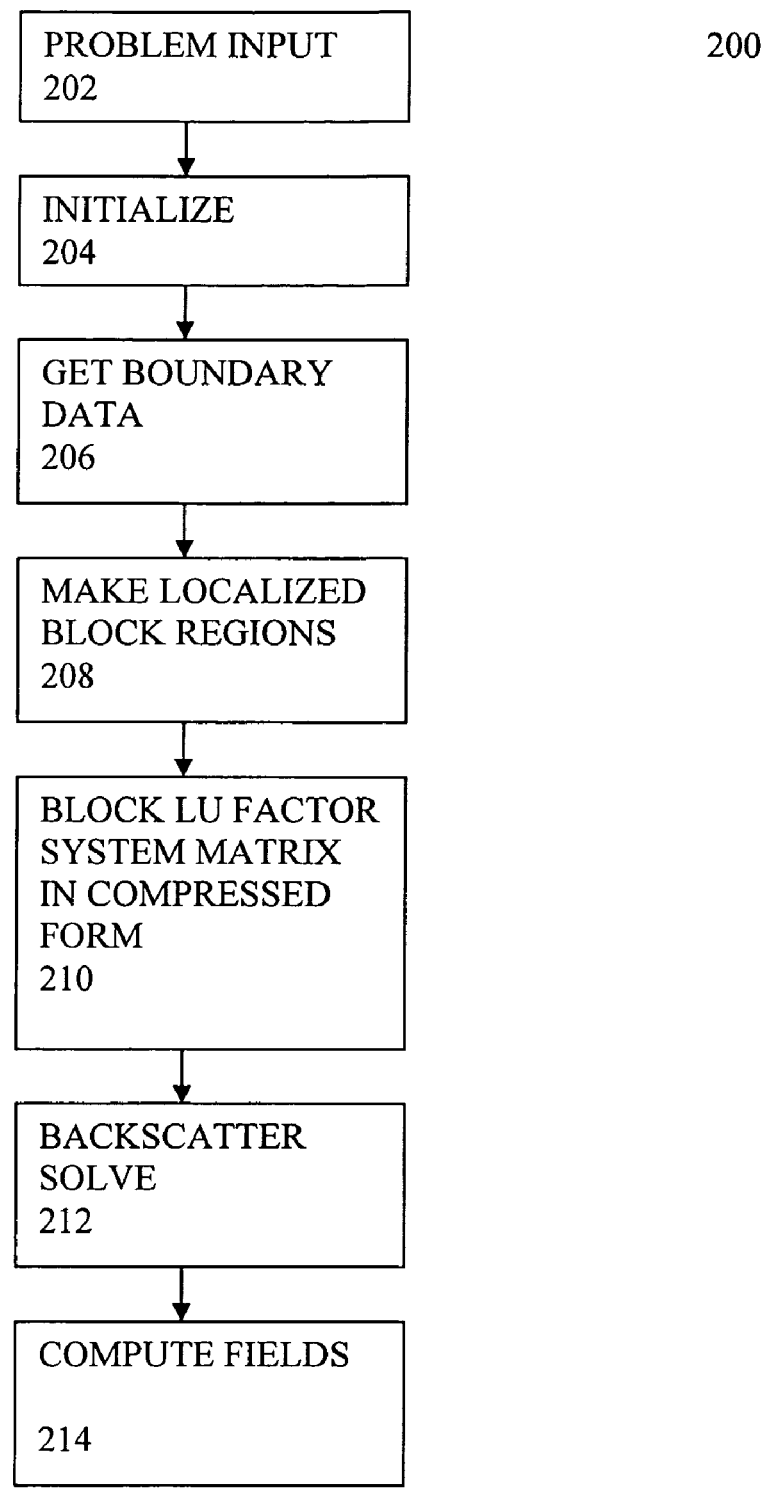
FIG. 2 depicts a flow chart of an embodiment for solving a system matrix equation according to the methods described herein.

FIG. 2 shows a flow chart 200 of one embodiment of a code for determining sources on an object using compressed factorization of a system interaction matrix:

Problem Input (element 202): Read input data file for basic input data. This includes geometry data describing the geometry of the object to be analyzed and designed.

Initialize Code (element 204): Set up matrix element data structures; Initialize variables; set various computational flags and data values.

Get Boundary Data (element 206): Read the geometry data nodes and triangle connectivity; eliminate duplicate nodes within specified tolerance; Compute, for each triangle, geometry parameters; Find couples, i.e., all triangle pairs that share a common edge. These unknowns associated with each couple become the unknowns for the geometry; Compute couple parameters.

Make Localized Block Regions (element 208): Apply a cobblestone-grouping algorithm to group unknowns into local spatial regions; This produces low rank compressed block matrices, to enable blocks of the input Z matrix to be low rank and thus compressible, to allow the right hand size voltage matrix for backscatter to be low rank, and to allow the LU back/forward solve for final currents J to be low rank and compressible.

Block LU Factor System Matrix (element 210): Using compressed block matrices, LU factor the system matrix, Z=LU. Not only is the system matrix LU factored using block sub-matrices, each sub-matrix, except diagonal blocks, is expressed in compressed form. The Adaptive Cross Approximation is used to computationally compute each matrix sub-block of the LU factors from the LU factor formula. The input Z matrix blocks are also computed in compressed low rank form using the ACA and the Z matrix fill subroutine.

Backscatter Solve (element 212): Using the block compressed LU factors of the system matrix, solve for the final block currents. For backscatter, this involves computing the right hand side block voltage matrix V for specified backscatter angles in compressed form Vu Vv. When the number of specified angles is large, these blocks are low rank, compressible, and thus computed using the ACA algorithm. Then, the final block currents J in compressed Ju Jv form are computed using the LU forward and back solve formulas using compressed forms for L and U, for input Vu Vv, for intermediate solution Xu Xv, and for final currents Ju Jv. Note that for bistatic scattering or antenna problems the V and J are not compressible matrices.

Compute Fields (element 214): The final polarization scattering matrix S is computed using compressed matrix representations of the block row measurement matrix and the computed block current solution J, [S]=[R][J].

Once the unknown sources J, have been determined they can be displayed in a graphical representation of sources on the object. Similarly, once the scattering matrix is computed, the scattering disturbance can also be displayed as a function angle.

Spatially blocked system matrices for electrically large bodies have very sparse blocks far from the diagonal. This occurs because there is little interaction between very distant parts of the body. In the ACA LU factor approach, sparseness and operations count reduction improves as block size increases. But increasing block size has limits. What one would like is for blocks far from the diagonal to get larger and thus sparser (less memory and operations). However, fundamental to LU factorization is that all blocks in the factors must have compatible dimensions.

One approach to letting a distant block increase in size is to split the system matrix into two parts, a far large distant block and a closer-in diagonal region made of smaller blocks. Thus, the system matrix equation may be solved as follows. Start by splitting the system matrix into the sum of two parts, a diagonal component of blocks near the diagonal and a remaining single large sparse block component. The system interaction matrix may then be written as $$Ax=(D+S)x=b$$

where an example of D and S is as follows:

$$Z = \begin{bmatrix} d & d & d & d & d & d & & & & \\ d & d & d & d & d & d & & & & \\ d & d & d & d & d & d & & & & \\ d & d & d & d & d & d & & & & \\ d & d & d & d & d & d & d & d & d & d \\ d & d & d & d & d & d & d & d & d & d \\ & & & & & & d & d & d & d & d & d \\ & & & & & & d & d & d & d & d & d \\ & & & & & & d & d & d & d & d & d \\ & & & & & & d & d & d & d & d & d \end{bmatrix} + \begin{bmatrix} & & & & & & s & s & s & s \\ & & & & & & s & s & s & s \\ & & & & & & s & s & s & s \\ & & & & & & s & s & s & s \\ & & & & & & & & & \\ & & & & & & & & & \\ s & s & s & s & & & & & & \\ s & s & s & s & & & & & & \\ s & s & s & s & & & & & & \\ s & s & s & s & & & & & & \end{bmatrix}$$

If the norm of D is larger than the norm of S, (that is, if S elements get very small, for large bodies, far from the diagonal)

$$\|D\|>\|S\|$$

then a solution approach can be written as $$D(I+D^{-1}S)x=b$$

whose solution is $$x=(I+D^{-1}S)^{-1}D^{-1}b$$

The leading term can be expanded into its series representation provided that $\|S\| < \|D\|$ A sparse memory solution approach would be to compute $D^{-1}$ in its LU factor form using the ACA approach. The series factorization would be $$x = \{I - (D^{-1}S) + (D^{-1}S)(D^{-1}S) - (D^{-1}S)(D^{-1}S)(D^{-1}S) + \dots\}D^{-1}b$$

$$= \left\{\sum_{k=0}^{\infty}(-1)^k(D^{-1}S)^k\right\}D^{-1}b \dots = \sum_{k=0}^{\infty} X_k$$

The first few terms of the solution are:

$$k = 0 \quad x_0 = D^{-1}b$$
$$k = 1 \quad x_1 = -(D^{-1}S)D^{-1}b = (D^{-1}S)x_0$$
$$k = 2 \quad x_2 = +(D^{-1}S)(D^{-1}S)D^{-1}b = -(D^{-1}S)x_1$$
$$k = 3 \quad x_3 = -(D^{-1}S)(D^{-1}S)(D^{-1}S)D^{-1}b = -(D^{-1}S)x_2$$
$$\vdots$$
$$x_k = -D^{-1}Sx_{k-1}$$

Thus, the $k^{th}$ solution update term is quite simple. The $D^{-1}$ inverse operation is the LU back solve using ACA solve outlined previously using compressed blocks where $D^{-1}$ is the LU ACA factored representation of D. S is computed from the Z matrix subroutine in compressed form as the outer product [Su][Sv]. No LU factorization has to be done on S. Since the number of rows and columns in S is much greater than for the blocks comprising D, S becomes very sparse (resulting in substantial memory savings).

Also, the solution X is sparse and thus compressible. By using the compressed form for X=Xu Xv, a very substantial reduction in operations count occurs.

The iterative update to the solution for S is written out using compressed matrices for S and for X:

$$X_k = -D^{-1}SX_{k-1}$$

$$= -D^{-1}Su\, Sv\, Xu_{k-1}Xv_{k-1} = -\{[D^{-1}][Su]\}([Sv][Xu_{k-1}])[Xv_{k-1}]\}$$

$$= \begin{bmatrix} -D^{-1} \end{bmatrix}\begin{bmatrix} Su \end{bmatrix}\begin{bmatrix} Sv \end{bmatrix}\begin{bmatrix} Xu_{k-1} \end{bmatrix}\begin{bmatrix} Xv_{k-1} \end{bmatrix} = \begin{bmatrix} -D^{-1}Su \end{bmatrix}$$

$$[Sv\ Xu_{k-1}][Xv_{k-1}]$$

$$= \begin{bmatrix} -D^{-1}Su \end{bmatrix}[Sv\ Xu_{k-1}\ Xv_{k-1}]$$

A substantial reduction in memory and operations count is achieved when doing the matrix multiplies in the order suggested. The $D^{-1}$ Su matrix needs to be computed only once, independent of the number of iterations. Su is a narrow column matrix (few columns). The $D^{-1}$ Su operation also produces a narrow column matrix. The inner product, Sv $X_{k-1}$, produces a small matrix whose number of rows is that of Sv (small) and number of columns of $X_{k-1}$. The outer product $[D^{-1}\,Su][Sv\,X_{k-1}]$ is then obtained to compute the $X_k$ iterative update. Convergence occurs when the norm of $\|X_k-X_{k-1}\|/\|X_k\|$ is less than a specified tolerance.

The memory and operations required to ACA LU factor D is less since the large S block is not contained in D by definition. The memory required for S in compressed form is less than if S had been included in D because S is sparse and is much larger than blocks in D. S requires no LU factor where as if S were a part of D, then blocks of S would require LU factorization, thereby increasing operations count. The number of iterations required for convergence is minimal since only weak distant interactions are included in S. The iteration matrix form takes significant advantage of the compressed form of S=Su Sv.

Figure 3:
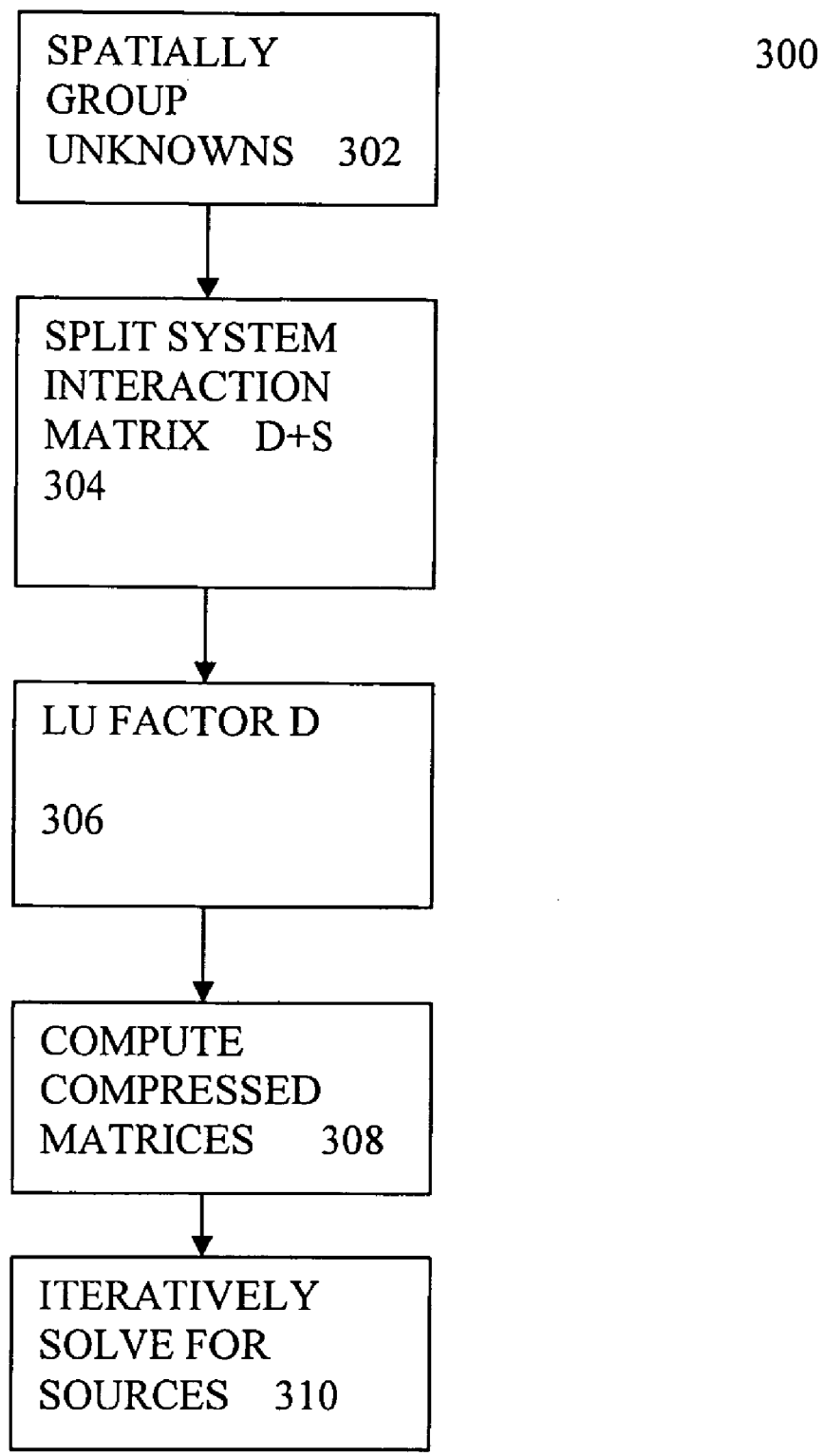
FIG. 3 depicts a flow chart of an alternative embodiment for solving a system matrix equation according to the methods described herein.

FIG. 3 shows a flow chart 300 of this alternative embodiment for solving for unknown sources. The embodiment comprises a method for determining a source function given an excitation of an object having a characteristic system interaction matrix, comprising: spatially grouping unknown sources of the source function according to their distances from one or more reference points so that the characteristic system interaction matrix exhibits low rank for a given error tolerance (element 302); splitting the system interaction matrix into the sum of two parts, a diagonal component of blocks D near the diagonal and a remaining single large sparse block component S (element 304); performing an LU factor of D (element 306); computing a compressed form of the sparse block component (element 308); and iteratively determining the source function from the compressed blocks (element 310).

Figure 4:
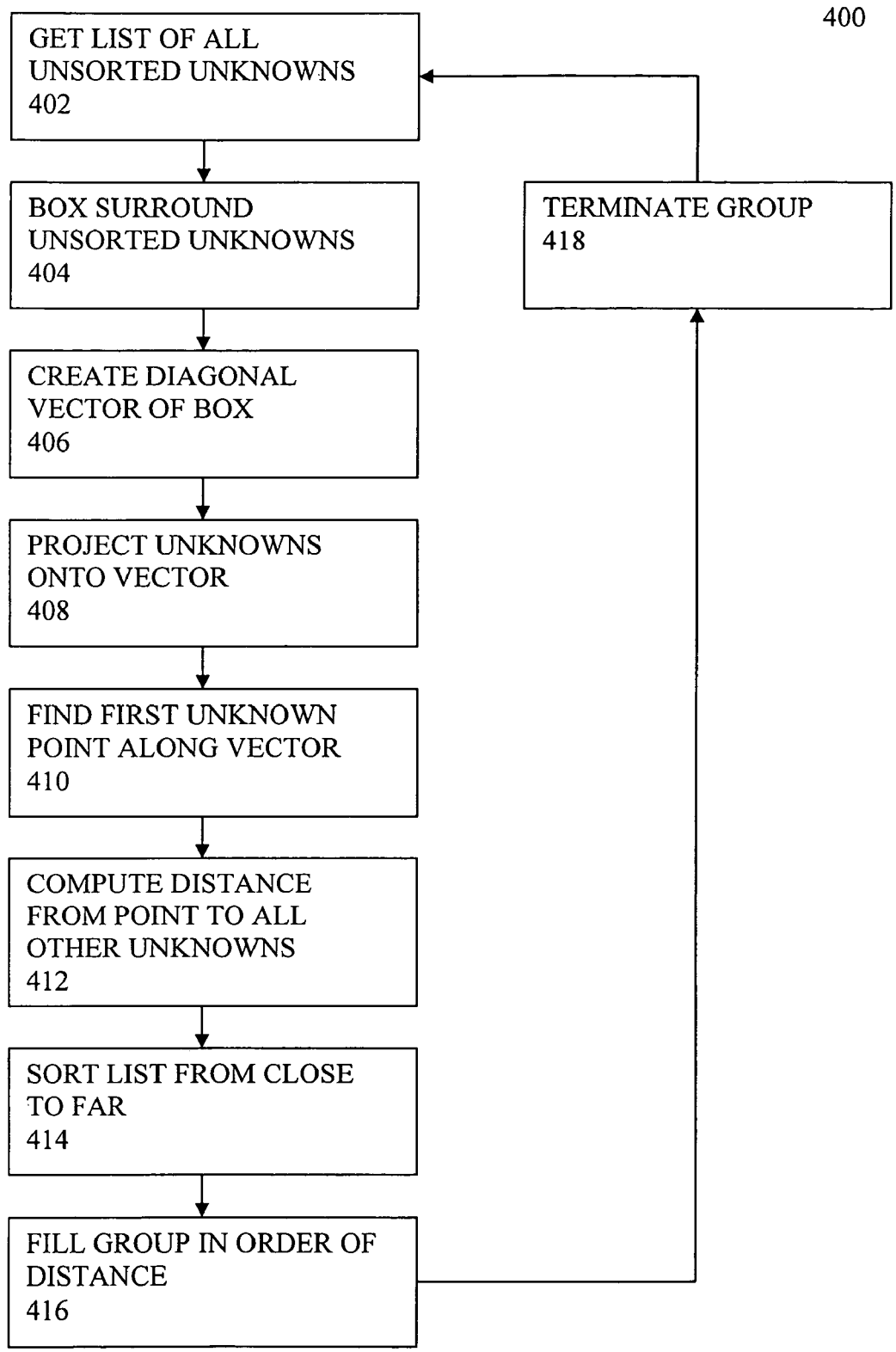
FIG. 4 depicts a flow chart of an embodiment for spatially grouping unknown sources.

FIG. 4 shows a flow chart 400 of an embodiment for spatially grouping unknowns using a "cobblestone" technique. In order that sub blocks of the Z, L, U, V, and J matrices have the physical property of rank deficiency (and thus compressible), these blocks must be comprised of or related to unknowns which are approximately spatially co-located, i.e., they must exist in a small spatial region subset of the overall geometry. Thus, given an input list of unknowns and their spatial (x,y,z) locations, the unknowns are grouped into local group blocks (spatial regions). Inputs to a spatial grouping subroutine can be: a list of unknowns and their spatial locations; the maximum desired group size; and the maximum distance between any two adjacent members of a group. Each group is to be composed of members that are sorted in distance in a smooth regular fashion from near to far. This smooth increasing change in distance is important when compressing the various low rank blocks of the system matrix equation, Z J=L U J=V. Key elements of these matrix blocks are related to phase (kr, with distance measured in wavelengths) and the 1/R amplitude fall off. It is desired that both phase and amplitude changes vary smoothly between members of a group. A key feature is that most, but not all, groups will have the same maximum size and that each new potential member of a group be within a specified distance of the last member of a group. These groups define the blocks in: the system matrix, Z, the L and U factor matrix, the right hand size backscatter voltage matrix, V, and the final current solution matrix, J.

Thus, embodiments comprise a method for spatially grouping and ordering source points of an object, so that a characteristic system interaction matrix of the object has low rank for a given error tolerance, each source point having a location and initially, for purposes of this method, being deemed unsorted and ungrouped. The method comprises, for each of the ungrouped source points, determining a distance from each source point to a reference point to produce a list of distances, each distance corresponding to a point. The method comprises sorting the points from smallest distance to largest distance. The method further comprises including in a group a first point and points whose distances are within a specified maximum distance from a previous point included in the group. According to the method the group is closed if a specified number of points are in the group. The steps of the method are repeated until all source points are sorted into groups.

First the process implemented by the code produces a list of all unsorted unknowns (element 402). Initially, this will be all unknowns. Next, the process creates a box surrounding the unsorted unknowns (element 404). The process finds the longest diagonal reference vector connecting two opposite corners of the box (element 406). Then, the process finds the projection of each unknown onto this diagonal vector (element 408). The process finds the first unknown point along the vector (element 410). This is the point with the smallest projection onto the reference vector. The process then determines the distances from each point's projection onto the reference vector from the initial point (element 412). The list is then sorted from close to far (element 414). The process then fills this spatial group in order of distance (element 416). The process terminates this fill when a maximum group size is achieved or when a distance from the last point to the next candidate point exceeds some specified value (element 418). Then, the process continues for all remaining unsorted points (element 402). This process results in a plurality of spatial groups, resulting in a system interaction matrix of rank deficient submatrix blocks with off-diagonal blocks having rank deficiency and are thus well approximated by matrices of low rank in outer product form.

Figure 5:
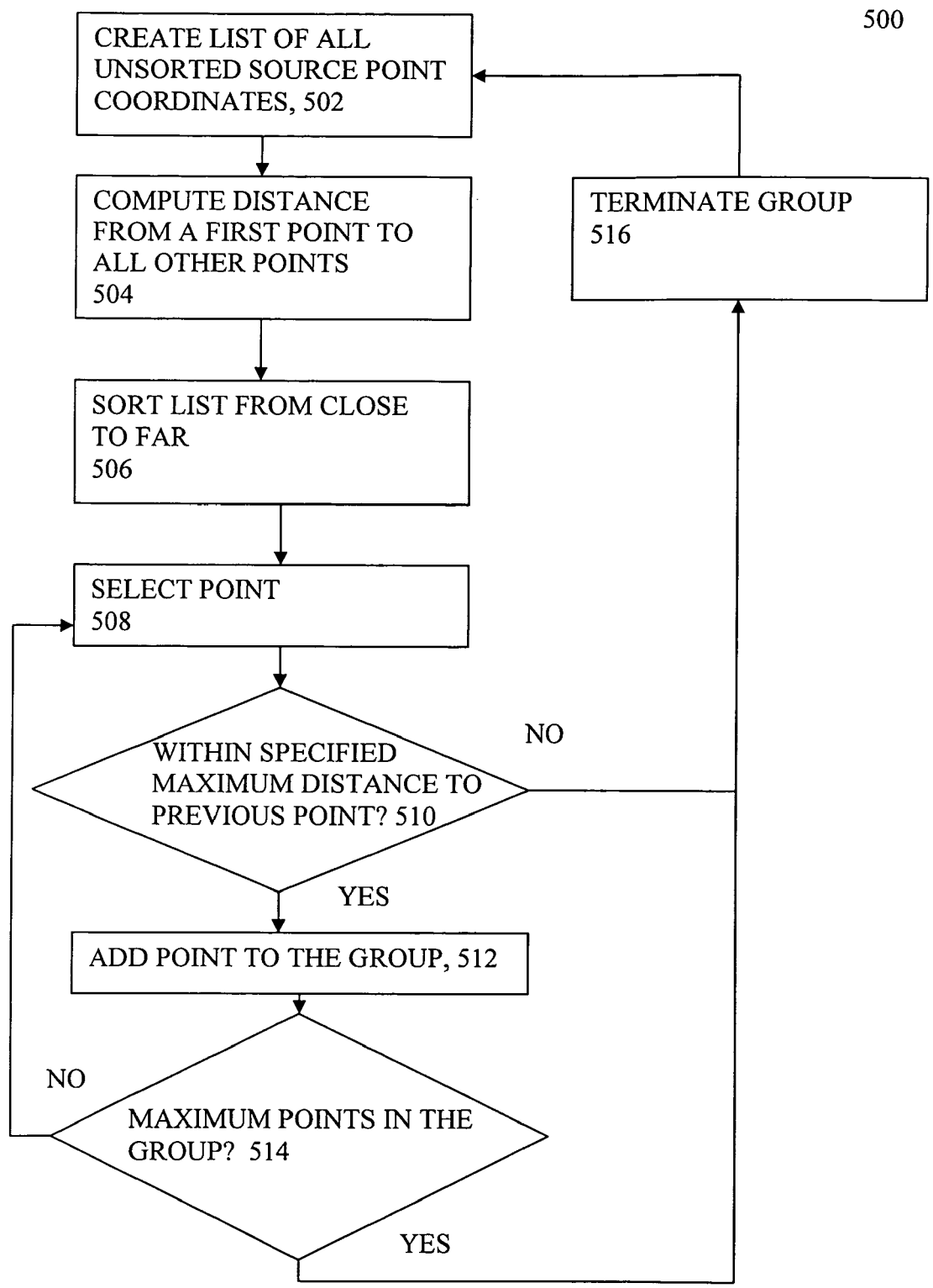
FIG. 5 depicts a flow chart of an embodiment for spatially grouping unknown sources.

Another embodiment for spatially grouping and ordering unknowns is shown in the flowchart 500 of FIG. 5. First, the system gets a list of all unsorted source points (element 502). Then, the system computes the distance from a first point to all other points (element 504). The points are then sorted from smallest distance to largest distance (element 506). A point is selected for candidacy in a current group (element 508). The system tests to determine if the selected point is within a specified maximum distance from the previous point included in the group (element 510). If the selected point is not within the specified maximum distance, the group is terminated (element 516). If the selected point is within the specified maximum distance, the point is added to the group (element 512). The system tests to determine if a maximum number of points are in the group (element 514). If so, the group is terminated (element 516). If not, a next point is selected for the group (element 508). Note that elements of the method of FIG. 4 can be combined with the testing of FIG. 5, to produce groups that have no two points further than a maximum allowable distance between them, and to limit the number of source locations in a group.

Some embodiments of the invention are implemented as a program product for use with a computer such as that shown in FIG. 1. The program product could be used on other computer systems or processors. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Thus, another embodiment of the invention provides a machine-accessible medium containing instructions effective, when executing by a machine, to cause the machine to perform a series of operations for determining sources on an object. The operations comprise spatially grouping and ordering unknown source locations according to their separation, each source associated with a point on a physical object, so that factors of a system interaction matrix that is characteristic of the object can be approximated by blocks of low rank. The operations further comprise logically partitioning the system interaction matrix into 9 or more blocks, $Z_{ij}$, so that the diagonal blocks are square and a dimension of a block corresponds to a number of unknown sources in a group, wherein logically partitioning the system interaction matrix is performed without computing $Z_{ij}$. The operations further comprise computing terms of L and U factors of the system interaction matrix in compressed outer product form, wherein the L and U factors have the following relationships:

$$U_{ij} = Z_{ij} - \sum_{p=1}^{i-1} L_{ip} U_{pj} \qquad , i, j = 1, 2, \ldots, n > 2$$

$$L_{ij} = Dinv_{jj} \left( Z_{ij} - \sum_{p=1}^{j-1} L_{ip} U_{pj} \right)$$

The operations also comprise determining the unknown sources from the terms of the compressed L and U factors of the system interaction matrix.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computer-implemented method for determining the unknown physical sources of an object arising from a physical excitation of the object that produces the sources, the object having associated therewith a system interaction matrix, Z, that is characteristic of the object and that depends on the object's geometry, comprising:

determining source locations from a geometry of the object stored in a tangible memory of the computer;

ordering and grouping the source locations according to their distance from a reference point so that factors of the system interaction matrix can be approximated by blocks of low rank;

logically partitioning the memory in a compressed outer product form to partition the system interaction matrix into 9 or more blocks, $Z_{ij}$, so that the diagonal blocks are square and a dimension of a block corresponds to a number of unknown source locations in a group, the logical partition created without computing $Z_{ij}$;

for the partition chosen, computing terms of a Lower Upper (LU) factorization of the partitioned system interaction matrix, wherein the LU factors are chosen to have the following relationship:

$$U_{ij} = Z_{ij} - \sum_{p=1}^{i-1} L_{ip} U_{pj}$$
$$L_{ij} = Dinv_{jj}\left(Z_{ij} - \sum_{p=1}^{j-1} L_{ip} U_{pj}\right)$$
$$i, j = 1, 2, \ldots, n > 2$$

and wherein terms of the L and U blocks of this factorization are computed and stored in a compressed outer product form and where $Dinv_{ij}$ are computed by LU factorization, computing and storing the factorization in the logically partitioned memory in a compressed outer product form to substantially reduce a number of computations and memory space required to determine the physical sources;

determining the physical sources, $J_i$ from terms of the compressed L and U factors, wherein the physical sources and the physical excitations, $V_i$, have the following relationship:

$$Y_i = V_i - \sum_{j=1}^{i-1} L_{ij} Y_j \quad i = 1, 2, \ldots, n$$
$$J_i = Dinv_u\left(Y_i - \sum_{j=i+1}^{n} U_{ij} J_j\right) \quad i = n, n-1, \ldots, 1.$$

2. The method of claim 1, further comprising determining a far field disturbance from the source function.

3. The method of claim 1, further comprising displaying the physical sources as a function of position on the object.

4. The method of claim 1, wherein ordering and grouping the source locations is according to the following method:

(a) for each of the ungrouped source points, determining a distance from each source point to a reference point to produce a list of distances, each distance corresponding to a point;

(b) sorting the points from smallest distance to largest distance, (c) including in a group a first point and points whose distances are within a specified maximum distance from a previous point included in the group;

(d) closing a group if a specified number of points are in the group; and (e) repeating steps (a) through (d) until all source points are sorted into groups.

5. The method of claim 1, wherein terms of the L and U factors that are computed and stored in compressed outer product form have the following relationship:

$$([Uu][Uv])_{ij} = ([Zu][Zv])_{ij} - \sum_{p=1}^{i-1} ([Lu][Lv])_{ip}([Uu][Uv])_{pj}$$
$$([Uu][Uv])_{ij} = Dinv_{jj}\left(([Zu][Zv]) - \sum_{p=1}^{j-1} ([Lu][Lv])_{ip}([Uu][Uv])_{pi}\right)$$

wherein Zu and Zv are the computed compressed outer product form of $Z_{ij}$, Lu and Lv are the computed compressed outer product form of L, Uu and Uv are the computed compressed outer product form of U and where Dinv is computed using LU factorization.

6. The method of claim 1, wherein the terms of the U-factors that are computed and stored in compressed outer product form have the following relationship $$([Uu][Uv])_{ij} = ([Zu][Zv])_{ij} - \sum_{p=1}^{i-1} ([Lu][Lv])_{ip}([Uu][Uv])_{pj}$$
$$([Uu][Uv])_{ij} = ([Zu][Zv])_{ij} - \sum_{p=1}^{i-1} ([Su][Sv])_{ij+p}$$
$$= \begin{bmatrix} Zu \\ \end{bmatrix}\begin{bmatrix} Zv & \end{bmatrix} - \sum_{p=1}^{i-1} \begin{bmatrix} Su \\ \end{bmatrix}\begin{bmatrix} Sv & \end{bmatrix}$$

where Su and Sv are computed according to the following relationships:

$$[Su] = [Lu]; \begin{bmatrix} Su \\ \end{bmatrix} = \begin{bmatrix} Lu \\ \end{bmatrix}$$
$$Sv = \{Lv\}[Uu][Uv] = \left(\begin{bmatrix} Lv & \end{bmatrix}\begin{bmatrix} Uu \\ \end{bmatrix}\right)\begin{bmatrix} Uv & \end{bmatrix} = \begin{bmatrix} Sv & \end{bmatrix}$$

and wherein only selected rows and columns of Su and Sv are multiplied to compute the right hand side of the equation for [Uu][Uv] thereby reducing operations count and storage.

7. The method of claim 1, wherein the terms of the L factors that are computed and stored in compressed outer product form have the following relationship $$([Lu][Lv])_{ij} = Dinv_{jj}\left\{([Zu][Zv])_{ij} - \sum_{p=1}^{j-1}([Lu][Lv])_{ip}([Uu][Uv])_{ij}\right\}$$

$$= \left\{(Dinv_{jj}[Zu][Zv])_{ij} - \sum_{p=1}^{j-1}([Su][Sv])_{ij-p}\right\}$$

$$= \left\{[Dinv_{jj}]\begin{bmatrix}Zu\\Zv\end{bmatrix} - \sum\begin{bmatrix}Su\\Sv\end{bmatrix}\right\}$$

$$\left\{\begin{bmatrix}SZu\\Zv\end{bmatrix} - \sum\begin{bmatrix}Su\\Sv\end{bmatrix}\right\}$$

where diagonal block Dinv is computed using LU factorization and where Su and Sv are computed according to the following relationships:

$$[Su] = [Dinv_{jj}][Lu]; \begin{bmatrix}Su\\\end{bmatrix} = [Dinv_{jj}]\begin{bmatrix}Lu\\\end{bmatrix}$$

$$Sv = [Lv][Uu][Uv] = \left([Lv]\begin{bmatrix}Uu\\Uv\end{bmatrix}\right)[Uv] = [Sv]$$

and where only a selected subset of rows and columns of Su and Sv are multiplied to compute the right hand side of the equation for [Lu][Lv] thereby reducing operations count and storage.

8. The method of claim 1, wherein the currents and excitation that are computed and stored have the following relationship:

$$([Yu][Yv])_i = ([Vu][Vv])_i - \sum_{j=1}^{i-1}([Lu][Lv])_{ij}([Yu][Yv])_j$$

$$([Ju][Jv])_i = Dinv_{ij}\left(([Yu][Yv])_i - \sum_{j=i-1}^{n}([Uu][Uv])_{ij}([Ju][Jv])_i\right)$$

wherein Vu and Vv are a computed compressed outer product form of the excitations, and Ju and Jv are a computed compressed outer product form of the sources, and Yu and Yv are a computed compressed outer product form of intermediate value Y and where Dinv is computed using LU factorization.

9. The method of claim 1, further comprising computing polarization scattering matrix scattering terms according to:

$$\begin{bmatrix}\sqrt{\sigma^{00}} & \sqrt{\sigma^{01}} \\ \sqrt{\sigma^{10}} & \sqrt{\sigma^{11}}\end{bmatrix} = [R][J] =$$

$$[V]^T[J] = [Vv]^T\{([Vu]^T[Ju])[Jv]\} = [Su][Sv]$$

wherein the computed Vu and Vv are the compressed outer product form of the excitations, and the computed Ju and Jv are the compressed outer product form of the sources.

10. The method of claim 1, further comprising modifying the geometry of the object based on the physical sources, $J_i$, to alter a measurable energy distribution of the object.

11. The method of claim 1, wherein the object is an antenna.

12. The method of claim 1, further comprising determining a compressed outer product form of multiple excitation functions and a compressed outer product form of multiple source functions each of the multiple source functions corresponding to an excitation function.

13. The method of claim 12, wherein the compressed forms of the excitation functions and source functions are determined from an adaptive cross approximation.

14. A computer for determining physical sources about a physical object in response to a physical excitation of the object, comprising:
   memory to store a geometry of the object and locations of the sources, and to store terms of compressed forms of an LU block factorization of a system interaction matrix that is characteristic of the object, and to store the excitation and sources, wherein the L and U factors have the following relationship:

$$U_{ij} = Z_{ij} - \sum_{p=1}^{i-1} L_{ip}U_{pi}$$

$$L_{ij} = Dinv_{jj}\left(Z_{ij} - \sum_{p=1}^{j-1} L_{ip}U_{pi}\right) \quad i, j = 1, 2, \ldots, n > 2$$

wherein terms of the L and U blocks of this factorization are computed and stored in a compressed outer product form and where diagonal blocks $Dinv_{jj}$ are computed by LU factorization; and
   a processor to compute a grouping and ordering of unknown sources so that factors of the system interaction matrix can be approximated by blocks of low rank, to compute a logical partitioning of the system interaction matrix into 9 or more blocks, $Z_{ij}$, by logically partitioning the memory in a compressed outer product form, so that diagonal blocks are square and a dimension of a block corresponds to a number of unknown sources in a group, and to compute for the partition, terms of the L and U factors of the LU block factorization of the system interaction matrix wherein terms of the L and U blocks are computed and stored in a compressed outer product form in the logically partitioned memory to substantially reduce a number of computations and memory space required to determine the unknown sources, and to determine the sources from the compressed L and U blocks.

15. The computer of claim 14, wherein the processor is to further compute a compressed outer product form of the excitations and the sources.

16. The computer of claim 14, wherein the processor is to further determine a far field disturbance arising from the sources.

17. The computer of claim 14, wherein the processor further modifies the geometry of the object in response to user input based on the computed sources to alter a measurable energy distribution of the object.

18. A computer program product comprising a computer useable tangible medium having a computer readable program, wherein the computer readable program when executed on a computer causes the computer to:

spatially group and order unknown source locations on a physical object having a specified geometry according to their separation, each source associated with a point on the physical object, so that factors of a system interaction matrix that is characteristic of the object can be approximated by blocks of low rank;

logically partition a memory of the computer in a compressed outer product form to partition the system interaction matrix into 9 or more blocks, $Z_{ij}$, so that the diagonal blocks are square and a dimension of a block corresponds to a number of unknown sources in a group, wherein logically partitioning the system interaction matrix is performed without computing $Z_{ij}$;

compute and store terms of L and U factors of the system interaction matrix in compressed outer product form in the logically partitioned memory to substantially reduce a number of computations and memory space required to determine the unknown sources, wherein the L and U factors have the following relationships:

$$U_{ij} = Z_{ij} - \sum_{p=1}^{i-1} L_{ip} U_{pi}$$

$$L_{ij} = Dinv_{jj}\left(Z_{ij} - \sum_{p=1}^{j-1} L_{ip} U_{pi}\right)$$

$i, j = 1, 2, \ldots, n > 2;$ and determine the unknown sources from the terms of the compressed L and U factors of the system interaction matrix.

19. The computer program product of claim 18, wherein the computer readable program further causes the computer to modify the specified geometry of the object in response to user input based on the determined sources, to alter a measurable energy distribution of the object.

* * * * *